United States Patent [19]

Van Der Kolk et al.

[11] Patent Number: 5,049,543
[45] Date of Patent: Sep. 17, 1991

[54] DEVICE AND METHOD OF MANUFACTURING A DEVICE

[75] Inventors: Gerrit J. Van Der Kolk; Theunis S. Baller; Bernard Dam, all of Eindhoven; Roger De Reus; Frans W. Saris, both of Amsterdam, all of Netherlands

[73] Assignee: U.S. Philips Corporation, New York, N.Y.

[21] Appl. No.: 316,395

[22] Filed: Feb. 27, 1989

[30] Foreign Application Priority Data

Apr. 5, 1988 [NL] Netherlands .................... 8800857

[51] Int. Cl.$^5$ .................................... H01B 12/00
[52] U.S. Cl. ........................... 505/1; 505/874; 505/702; 357/5
[58] Field of Search ............... 357/5; 505/874, 1, 72

[56] References Cited

U.S. PATENT DOCUMENTS

| 4,319,256 | 3/1982 | Tarutani et al. | 357/5 |
| 4,432,134 | 2/1984 | Jones et al. | 357/5 |
| 4,470,190 | 9/1984 | Fulton et al. | 357/5 |

FOREIGN PATENT DOCUMENTS

| 58-110084 | 6/1983 | Japan | 357/5 |
| 58-209175 | 12/1983 | Japan | 357/5 |
| 58-212186 | 12/1983 | Japan | 357/5 |
| 60-148178 | 8/1985 | Japan | 357/5 |
| 61-6882 | 1/1986 | Japan | 357/5 |
| 62-163379 | 7/1987 | Japan | 357/5 |

OTHER PUBLICATIONS

IBM Technical disclosure bulletin, vol. 26, No. 10A, Mar./84, Planarized Structure for Josephson Tunnel Junction, R. F. Broom et al.

Primary Examiner—Andrew J. James
Assistant Examiner—Dang Xuan Hung
Attorney, Agent, or Firm—John C. Fox

[57] ABSTRACT

A device comprising semiconductor elements and conductor tracks of an oxidic superconductive material, electrically conductive connections being established between the semiconductor elements and the conductor tracks, is provided with an electrically conductive antidiffusion layer between the semiconductor elements and the conductor tracks. The antidiffusion layer consists of an amorphous alloy of two transition metals, which alloy has a crystallization temperature of at least 900 K. The amorphous alloy has the composition $A_xB_{1-x}$, wherein A is selected from Ti, Zr, Hf, Nb and Ta, wherein B is selected from Ir, Pd and Pt, and wherein x has a value from 0.4 to 0.8.

5 Claims, 1 Drawing Sheet

DEVICE AND METHOD OF MANUFACTURING A DEVICE

BACKGROUND OF THE INVENTION

The invention relates to a device comprising semiconductor elements and conductor tracks of an oxidic superconductive material, electrically conductive connections being formed between the semiconductor elements and the conductor tracks, the electrically conductive connections comprising at least one antidiffusion layer. If desired, the electrically conductive connection may be formed only by the antidiffusion layer.

The invention also relates to a method of manufacturing such a device.

In an article by M. Gurvitch and A. T. Fiory in Applied Physics Letters 51 (13), pages 1027 to 1029 (1987) a method is described of manufacturing of thin layers of the oxidic superconductive compound $YBa_2Cu_3O_7$ in accordance with a pattern on various substrates, such as silicon. With most of the substrates it was found that an antidiffusion layer is necessary. To this end, not only were electrically insulating layers investigated but also electrically conductive antidiffusion layers, such as layers of Ag, Nb and Cu. Moreover, their application to silicon substrates did not have the desired result because of the poor adhesion of the layers and because the oxidic compound did not exhibit superconductive behaviour at the desired temperatures (exceeding 77° K.).

Substrates to which oxidic superconductive materials can be applied with good results are in general insulating oxidic materials, such as MgO, $ZrO_2$ and $SrTiO_3$, and noble metals such as gold and silver. Gold and silver can be used to form electrically conductive connections. However, these metals are not very suitable for use as a diffusion barrier. Gold is less suitable for use in contact with semiconductor devices owing to the possible formation of a Si-Au eutectic composition at a low temperature. Silver is unsuitable because of the high diffusion rate of silver itself.

Antidiffusion layers for use in semiconductor devices must meet a number of requirements. In semiconductor technology, for example, protective layers of $Si_3N_4$ are used which are applied at a temperature of 450° C. At this temperature no undesired reactions must occur in and between the previously applied layers. At this temperature oxidation of the antidiffusion layers must not occur either.

SUMMARY OF THE INVENTION

It is an object of the invention to provide electrically conductive antidiffusion layers which can be used at customary temperatures (up to 550° C.) and in customary methods for the manufacture of semiconductor devices. In such applications, the antidiffusion layers must not react with semiconductor materials such as Si, SiGe, GaAs or with superconductive oxidic materials such as $YBa_2Cu_3O_7$. The antidiffusion layers must consist of a material which has a stable structure and which does not oxidize at a low temperature (below 450° C.).

This object is achieved in accordance with the invention by a device as described in the opening paragraph, in which the antidiffusion layer consists of an amorphous alloy of two transition metals, which alloy has a crystallization temperature of at least 900° K.

A suitable amorphous alloy has the following composition: $A_xB_{1-x}$ wherein A is selected from Ti, Zr, Hf, Nb and, Ta and wherein B is selected from Ir, Pd and Pt, and wherein x has a value of from 0.4 to 0.8.

Owing to the use of an amorphous alloy, an effective diffusion barrier is obtained because there can be no transport along grain boundaries since such boundaries are nonexistent in amorphous alloys. The amorphous layers are stable because the temperatures to which they are exposed during further processing of the semiconductor device are well below their crystallization temperatures. The alloys selected do not react with elements of semiconductor materials such as Si, Ge, Ga and As at temperatures up to 800° K. An additional advantage is that at temperatures up to 800° K. the alloys do not react with aluminum either which can be used in conductor tracks on semiconductor devices. Aluminum layers can be provided on the device both before and after the application of the amorphous metal alloys.

DETAILED DESCRIPTION OF THE INVENTION

Figure 1:
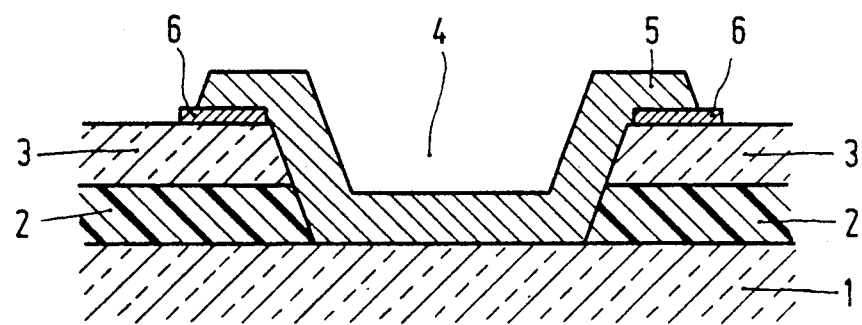
FIG. 1 is a schematic sectional view of an embodiment of a device provided with an electrically conductive connection in accordance with the invention.

The invention will now be described in greater detail for a more complete understanding of the invention.

In a preferred embodiment of the device in accordance with the invention, the amorphous alloy is selected from $Ti_xIr_{1-x}$ wherein x has a value from 0.4 to 0.8, $Nb_xIr_{1-x}$ wherein x has a value from 0.4 to 0.7, and $Ta_xIr_{1-x}$ wherein x has a value from 0.4 to 0.7.

In accordance with an alternative preferred embodiment, the amorphous alloy is selected from $Hf_xPd_{1-x}$ wherein x has a value from 0.5 to 0.8, $Nb_xPd_{1-x}$ wherein x has a value from 0.4 to 0.75, and $Ta_xPd_{1-x}$ wherein x has a value from 0.4 to 0.7.

In another preferred embodiment of the invention, the amorphous alloy is selected from $Ti_xPt_{1-x}$ wherein x has a value from 0.5 to 0.8, $Zr_xPt_{1-x}$ wherein x a value from 0.4 to 0.7.

$Hf_xPt_{1-x}$ wherein x has a value from 0.4 to 0.7, $Nb_xPt_{1-x}$ wherein x has a value from 0.5 to 0.8, and $Ta_xPt_{1-x}$ wherein x has a value from 0.4 to 0.75.

In order to obtain the desired oxygen content and, hence, the desired superconductive properties, thin layers of oxidic superconductive materials are applied at a high temperature or are subjected to an aftertreatment at a high temperature in air or oxygen. In an article by H. Adachi et. al. in Applied Physics Letters 51 (26), pages 2263 to 2265 (1987) a description is given of a method by means of which superconductive $YBa_2Cu_3O_7$ can be manufactured at the relatively low temperature of 650° C. At said temperature oxidation may occur in some of the above-mentioned amorphous metal alloys. For this reason, the method of manufacturing a semiconductor device having superconductive tracks is preferably carried out such that the firing of the superconductive material can take place before the amorphous metal alloy is provided.

The object of providing a method of manufacturing a device comprising semiconductor elements and conductor tracks of an oxidic material is achieved in accordance with the invention by a method in which the superconductive material is fired after it has been provided in order to obtain the desired superconductive properties, the electrically conductive connections being provided after firing via apertures in the superconductive material which are provided in accordance with a pattern.

For example, MgO and SrTiO$_3$ may be applied in known manner as electrically insulating layers between the superconductive tracks and the underlying semiconductor elements, between which there must be no electric contact. In experiments leading to the invention it has been found that the use of MgO may lead to some reaction between this material and the superconductive material. SrTiO$_3$ has a high relative dielectric constant (100 to 200) which may lead to undesired capacitances in a semiconductor device. Consequently, this material is less suitable for applications requiring high switching speeds.

Therefore, a particularly advantageous embodiment of the method in accordance with the invention is characterized in that a patterned electrically insulating layer between the semiconductor elements and the conductor tracks is manufactured from an amorphous alloy of two transition metals, which alloy is fired simultaneously with the superconductive material, thereby forming electrically insulating metal oxides. This embodiment of the method is very simple because while the same materials are used, a change in the process sequence will nevertheless lead to the desired result. The amorphous metal alloys which are provided before firing form insulating layers, the amorphous metal alloys which are provided after firing form conductive connections. Very suitable insulating metal oxides which can be obtained in this way are Ta$_2$O$_3$, HfO$_2$ and ZrO$_2$.

An oxidic superconductive material which can be used in the device and the method in accordance with the invention is (La,Sr)$_2$CuO$_4$, wherein Sr can be replaced by Ba. Another suitable oxidic superconductive material is YBa$_2$Cu$_3$O$_{7-\delta}$, wherein $\delta$ has a value from 0.1 to 0.5. YBa$_2$Cu$_3$O$_{7-\delta}$ has a value $T_c$ of approximately 90° K. Oxygen may partly be substituted by fluorine, for example up to 1 atom in the composition al formula indicated, which leads to an increase of $T_c$. Further, Y may be substituted by one or more rare earth metals and Ba may be substituted by another alkaline earth metal, for example Sr. $T_c$ is the critical temperature below which the material exhibits superconductive behaviour. Other oxidic superconductive materials may also be used in accordance with the invention, such as, for example, a cuprate containing Bi, Ca and Sr, having a $T_c$ which exceeds 100° K.

U.S. Pat. No. 4,546,373 describes the use of amorphous TaIr alloys as an antidiffusion layer between GaAs and Au in a semiconductor device at temperatures up to 773° K. The amorphous TaIr does not contact superconductive or oxidic materials. Only few materials have proved to be suitable for use in contact with oxidic superconductive materials at a high temperature. To use TaIr with superconductive compounds therefore is not very obvious. The only metals which were known to be suitable for this purpose are the noble metals gold and silver.

In an article by L. S. Hung et. al. in Journal of Applied Physics 60 (12), pages 4177 to 4181 (1986) a description is given of the use of amorphous diffusion barriers of CoTa and CoMo between silicon on the one hand and gold and aluminum on the other hand. The use at temperatures up to 450° C. requires the presence of additional layers, for example a layer of TaAl$_3$.

The invention will be explained in more detail by means of exemplary embodiments and with reference to the drawing.

EXAMPLE 1

From the enthalpy of formation of the alloys it can be derived that the following alloys of transition metals react only at a high temperature with, for example, semiconductor materials: TaIr, TaPt, TaPd, TaRh, HfPt, HfPd, ZrPt, ZrAu, ZrPd, NbIr, NbPt, NbRh, NbPd, YPt, YPd, VIr, TiIr, TiPt, TiRh, TiPd, ScPt, ScAu and ScPd.

The crystallization temperature of a number of values of x was determined for amorphous alloys of the composition A$_x$B$_{1-x}$ wherein A is selected from Ti, Zr, Hf, Nb and Ta and wherein B is selected from Ir, Pd and Pt. For this purpose, thin layers of the amorphous alloys were manufactured by means of vapour deposition on NaCl single crystals. The amorphous alloys were fired at ever increasing temperatures and subsequently cooled to measure the degree of crystallinity. The crystallinity was determined by means of X-ray diffraction and electron diffraction.

The table below lists a range of compositions and the corresponding lowest crystallisation temperature in that range of a number of alloys.

TABLE

| A | B | x | $T_k$ (K) |
|---|---|---|---|
| Ta | Ir | 0.4–0.7 | 1170 |
| Ta | Pt | 0.4–0.75 | 1170 |
| Hf | Pt | 0.4–0.7 | 970 |
| Zr | Pt | 0.4–0.7 | 900 |
| Nb | Ir | 0.4–0.7 | 1100 |
| Nb | Pt | 0.5–0.8 | 1100 |
| Ta | Pd | 0.4–0.7 | 1100 |
| Hf | Pd | 0.5–0.8 | 900 |
| Ti | Ir | 0.4–0.8 | 970 |
| Ti | Pt | 0.5–0.8 | 970 |
| Nb | Pd | 0.4–0.75 | 1020 |

Since it is stated in the above-mentioned article by L. S. Hung et. al. that even at a temperature below the crystallization temperature a reaction may occur between an amorphous metal alloy and silicon, a number of experiments were carried out in which amorphous metal alloys were brought into contact with a number of materials and heated. The results were analysed by means of X-ray diffraction and Rutherford back scattering (RBS).

By means of electron beam evaporation thin layers of TaIr and TaPd were provided on silicon. In the case of TaIr no reaction occurs between the amorphous metal alloy and the substrate at temperatures up to 1050° K. and in the case of TaPd no reaction occurs at temperatures up to 850° K., for compositions with values for x as listed in the table.

A layer of YBa$_2$Cu$_3$O$_7$ having a thickness of 1 $\mu$m was applied by means of laser ablation on a thin TaIr layer on a silicon substrate. If the amorphous metal alloy is heated in oxygen it oxidizes at a temperature of 770° K., thereby forming a polycrystalline oxide. At temperatures up to 920° K. no reaction takes place with the superconductive material, and no reaction takes place with silicon at temperatures up to 1120° K. For the other amorphous metal alloys the temperature at which oxidation takes place is also between 750° and 850° K.

A layer of $YBa_2Cu_3O_7$ having a thickness 1 μm was provided on an $SrTiO_3$ substrate by means of radio frequency sputtering of the metals, followed by oxidation. Subsequently, a layer of TaIr was provided which in a vacuum does not react with the superconductive compound at temperature up to 1020° K.

EXAMPLE 2

FIG. 1 shows a silicon substrate 1 on which a magnesium oxide insulating layer 2 is provided in accordance with a pattern, the latter layer carrying an oxidic superconductive layer 3 of $YBa_2Cu_3O_{6.7}$. GaAs may alternatively be used as a substrate material. The insulating layer may also be formed of, for example, $SrTiO_3$ or $ZrO_2$.

A suitable method of applying an oxidic superconductive layer is described in the above-mentioned article by H. Adachi et. al, for example. A suitable method of manufacturing such layers in accordance with a pattern is described in the above-mentioned article by M. Gurvitch and A. T. Fiory, for example.

According to that method, a metallic alloy of Y, Ba and Cu is deposited by magnetron sputtering and subsequently oxidized. After a preannealing step (5 minutes at 800° C. in pure oxygen) the film is patterned by conventional lithographic processes and etching in 0.01N nitric or acetic acid. Then the patterned film 3 is reannealed for several minutes at 920° C.

An electrically conductive connective is formed between the semiconductor material 1 and the superconductive layer 3 via an aperture 4 in the insulating layer 2 and the superconductive layer 3, by means of a layer 5 of an amorphous metal alloy, in the present example $Ta_{0.5}Pd_{0.5}$.

If desired, a layer 6 of silver or gold may be applied between the superconductive layer 3 and the amorphous metal layer 5 in order to improve the electric contact.

In the additional steps in the manufacture of the semiconductor device no temperatures exceeding 800° K. are used. The result is a satisfactory electrically conductive contact between a conductor track of a superconductive material and (not shown in the drawing) semiconductor elements in the substrate, mutual diffusion being avoided.

EXAMPLE 3

Figure 2:
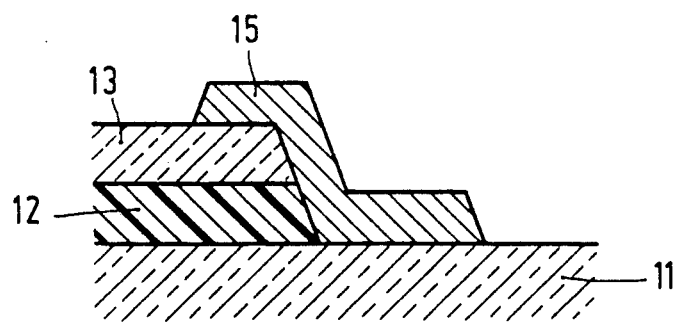
FIG. 2 is a schematic sectional view of an additional embodiment of a device provided with an electrically conductive connection in accordance with the invention.

FIG. 2 shows a substrate 11 which consists of, for example, silicon and on which a layer 12 of the amorphous metal alloy $Ta_{0.55}Ir_{0.45}$ is applied in accordance with a pattern. A layer 13 of $YBa_2Cu_5O_{6.7}$ is provided on top of the latter layer. Both layers are fired simultaneously at a temperature of 1170° K. In this operation the layer 12 is converted into a polycrystalline electrically insulating layer of $Ta_2O_3$ and $IrO_2$ and the layer 13 yields the desired composition with superconductive properties. No reaction takes place between the insulating layer 12 and the layers contacting it.

An electrically conductive connection 15 of $Ta_{0.55}Ir_{0.45}$ is established between the substrate and the superconductive material in the manner shown in Example 2.

We claim:

1. A device comprising semiconductor elements and conductor tracks of an oxidic superconductive material, electrically conductive connections being formed between the semiconductor elements and the conductor tracks, the electrically conductive connections comprising at least one antidiffusion layer, characterized in that the antidiffusion layer consists of an amorphous alloy of two transition metals, which alloy has a crystallisation temperature of at least 900° K.

2. A device as claimed in claim 1, characterized in that the amorphous alloy has the composition $A_xB_{1-x}$ wherein A is selected from the group consisting of Ti, Zr, Hf, Nb and Ta and wherein B is selected from the group consisting of Ir, Pd and Pt, and wherein x has a value of from 0.4 to 0.8.

3. A device as claimed in claim 2, characterized in that the amorphous alloy is selected from the group consisting of $Ti_xIr_{1-x}$ wherein x has a value of from 0.4 to 0.8, $Nb_xIr_{1-x}$ wherein x has a value of from 0.4 to 0.7 and $Ta_xIr_{1-x}$ wherein x has a value of from 0.4 to 0.7.

4. A device as claimed in claim 2, characterized in that the amorphous alloy is selected from the group consisting of $Hf_xPd_{1-x}$ wherein x has a value of from 0.5 to 0.8, $Nb_xPd_{1-x}$ wherein x has a value of from 0.4 to 0.75 and $Ta_xPd_{1-x}$ wherein x has a value of from 0.4 to 0.7.

5. A device as claimed in claim 2, characterized in that the amorphous alloy is selected from the group consisting of $Ti_xPt_{1-x}$ wherein x has a value of from 0.5 to 0.8, $Zr_xPt_{1-x}$ wherein x has a value of from 0.4 to 0.7, $Hf_xPt_{1-x}$ wherein x has a value of from 0.4 to 0.7, $Nb_xPt_{1-x}$ wherein x has a value of from 0.5 to 0.8, and $Ta_xPt_{1-x}$ wherein x has a value of from 0.4 to 0.75.

* * * * *